US010340663B2

United States Patent
Kotani et al.

(10) Patent No.: US 10,340,663 B2
(45) Date of Patent: Jul. 2, 2019

(54) QUANTUM CASCADE LASER

(71) Applicants: Sharp Kabushiki Kaisha, Sakai, Osaka (JP); The University of Tokyo, Bunkyo-ku, Tokyo (JP)

(72) Inventors: Teruhisa Kotani, Sakai (JP); Yasuhiko Arakawa, Bunkyo-ku (JP)

(73) Assignees: SHARP KABUSHIKI KAISHA, Sakai (JP); THE UNIVERSITY OF TOKYO, Tokyo (JP)

( * ) Notice: Subject to any disclaimer, the term of this patent is extended or adjusted under 35 U.S.C. 154(b) by 16 days.

(21) Appl. No.: 15/599,620

(22) Filed: May 19, 2017

(65) Prior Publication Data
US 2017/0338627 A1    Nov. 23, 2017

(30) Foreign Application Priority Data

May 20, 2016 (JP) ................................ 2016-101182

(51) Int. Cl.
*H01S 5/00* (2006.01)
*H01S 5/34* (2006.01)
(Continued)

(52) U.S. Cl.
CPC .......... *H01S 5/3421* (2013.01); *H01S 5/2018* (2013.01); *H01S 5/3402* (2013.01);
(Continued)

(58) Field of Classification Search
CPC .... H01S 5/3421; H01S 5/2018; H01S 5/3402; H01S 5/34313; H01S 5/1096;
(Continued)

(56) References Cited

U.S. PATENT DOCUMENTS 8,121,164 B1 *  2/2012  Lyakh ................... B82Y 20/00
                                                    372/44.01
9,001,858 B1 *  4/2015  Hirayama ............. H01S 5/3425
                                                    372/45.012
(Continued)

FOREIGN PATENT DOCUMENTS

EP    2 988 381 A2    2/2016
JP    2013-171842 A    9/2013

OTHER PUBLICATIONS

V.D. Jovanović et al., "Simulation and design of GaN/AlGaN far-infrared (λ~34 μm) quantum-cascade laser" Applied Physics Letters, vol. 84, No. 16, Apr. 19, 2004, pp. 2995-2997.*
(Continued)

*Primary Examiner* — Jessica S Manno
*Assistant Examiner* — Delma R Fordé
(74) *Attorney, Agent, or Firm* — Keating & Bennett, LLP

(57) ABSTRACT

A quantum cascade laser includes a semiconductor substrate and an active layer having a cascade structure, in which unit layered bodies, each composed of a quantum well light emitting layer and an injection layer, are stacked, wherein the unit layered body has a subband level structure having an upper laser level, a lower laser level, and a relaxation miniband composed of at least two energy levels with an energy spacing smaller than the energy difference ($E_{UL}$) between the upper laser level and the lower laser level, the energy width of the relaxation miniband is smaller than the energy ($E_{LO}$-$E_{UL}$) obtained by subtracting the energy difference ($E_{UL}$) from the energy ($E_{LO}$) of longitudinal optical phonons, and electrons subjected to the intersubband transition are relaxed in the relaxation miniband and are injected into a quantum well light emitting layer in a subsequent unit layered body.

6 Claims, 6 Drawing Sheets

(51) Int. Cl.
  *H01S 5/20* (2006.01)
  *H01S 5/343* (2006.01)
  *H01S 5/10* (2006.01)
  *H01S 5/183* (2006.01)
  *H01S 5/22* (2006.01)

(52) U.S. Cl.
  CPC ...... *H01S 5/34313* (2013.01); *H01S 5/34333* (2013.01); *H01S 5/1096* (2013.01); *H01S 5/18397* (2013.01); *H01S 5/22* (2013.01); *H01S 5/34* (2013.01); *H01S 5/3408* (2013.01); *H01S 5/3415* (2013.01); *H01S 5/34306* (2013.01); *H01S 2301/166* (2013.01); *H01S 2301/173* (2013.01); *H01S 2302/02* (2013.01)

(58) Field of Classification Search
  CPC .. H01S 5/18397; H01S 5/34306; H01S 5/343; H01S 5/34; H01S 5/22; H01S 5/3408; H01S 5/3415; H01S 5/34333; H01S 2301/173; H01S 2301/166; H01S 2302/02
  See application file for complete search history.

(56) References Cited

U.S. PATENT DOCUMENTS

| | | | | |
|---|---|---|---|---|
| 10,008,829 | B2* | 6/2018 | Dougakiuchi | H01S 5/3402 |
| 10,014,662 | B2* | 7/2018 | Fujita | H01S 5/2018 |
| 2006/0215718 | A1* | 9/2006 | Yasuda | B82Y 20/00 |
| | | | | 372/45.012 |
| 2009/0213890 | A1* | 8/2009 | Patel | B82Y 20/00 |
| | | | | 372/45.012 |
| 2010/0111127 | A1* | 5/2010 | Edamura | B82Y 20/00 |
| | | | | 372/45.012 |
| 2011/0007768 | A1* | 1/2011 | Yamanishi | B82Y 20/00 |
| | | | | 372/45.01 |
| 2011/0026556 | A1* | 2/2011 | Fujita | B82Y 20/00 |
| | | | | 372/45.012 |
| 2014/0241392 | A1* | 8/2014 | Edamura | H01S 5/3402 |
| | | | | 372/45.012 |
| 2016/0064901 | A1* | 3/2016 | Terashima | H01S 5/042 |
| | | | | 372/4 |
| 2016/0087408 | A1* | 3/2016 | Fujita | H01S 5/0604 |
| | | | | 372/45.012 |
| 2017/0201071 | A1* | 7/2017 | Kotani | H01S 5/3401 |
| 2017/0201072 | A1* | 7/2017 | Kotani | H01S 5/3401 |

OTHER PUBLICATIONS

Greg Sun et al., "Active region design of terahertz GaN/Al1.05Ga0.85N quantum cascade laser", Superlattices and Microstructures 37 (2005) pp. 107-113.*

H. Hirayama et al., "Recent progress toward realizing GaN-based THz quantum cascade laser" Quantum sensing and nanophotonic devices XI, Proc. of SPIE vol. 8993, 2014, pp. 89930G-1 to 89930G-9.*

Alessandro Tredicucci et al., Terahertz quantum cascade laser-first demonstration and novel concepts, Institute of Physics Publishing, Semiconductor Science and Technology 20 (2005) pp. S222-S227.*

WO2015186462 English translation Dec. 10, 2015 pp. 1-19.*

Optical Properties of Gallium Arsenide (GaAs), Aug. 31, 2018, pp. 1-3.*

Optical Properties of Gallium Indium Arsenide (GaInAs) Aug. 31, 2018, pp. 1-2.*

Tredicucci et al., "Terahertz quantum cascade lasers—first demonstration and novel concepts", Semiconductor Science and Technology 20, Jun. 8, 2005, 6 pages.

Sun et al., "Active region design of a terahertz GaN/Al0.15Ga0.85N quantum cascade laser", Superlattices and Microstructures 37, Oct. 22, 2004, 7 pages.

Hirayama et al., "Recent progress toward realizing GaN-based THz quantum cascade laser", Proceedings of SPIE, vol. 8993, 89930G, Jan. 31, 2014, 9 pages.

* cited by examiner

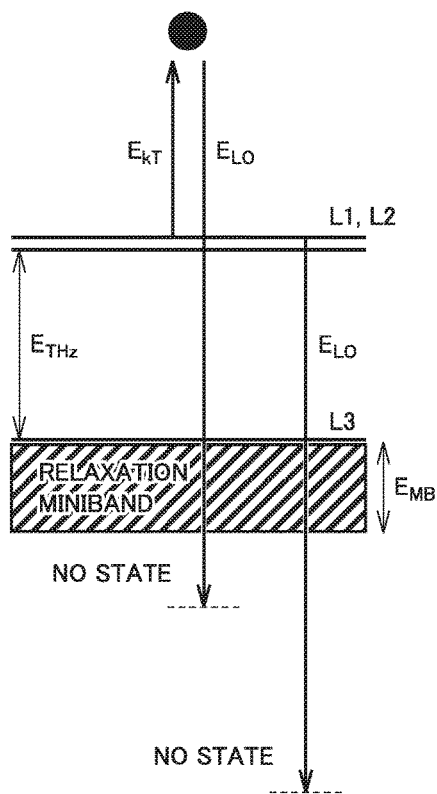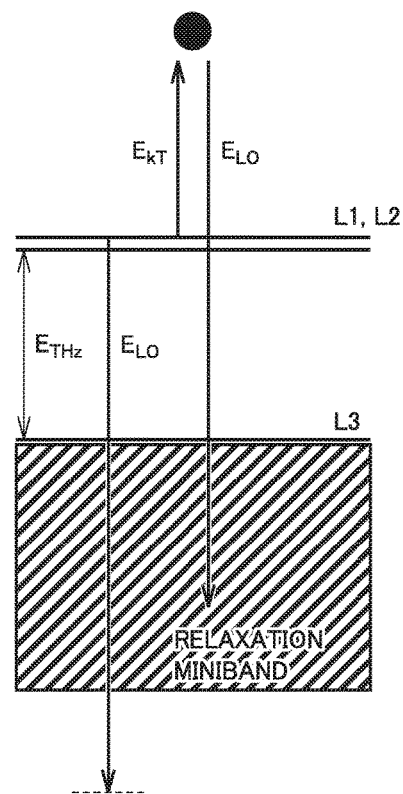

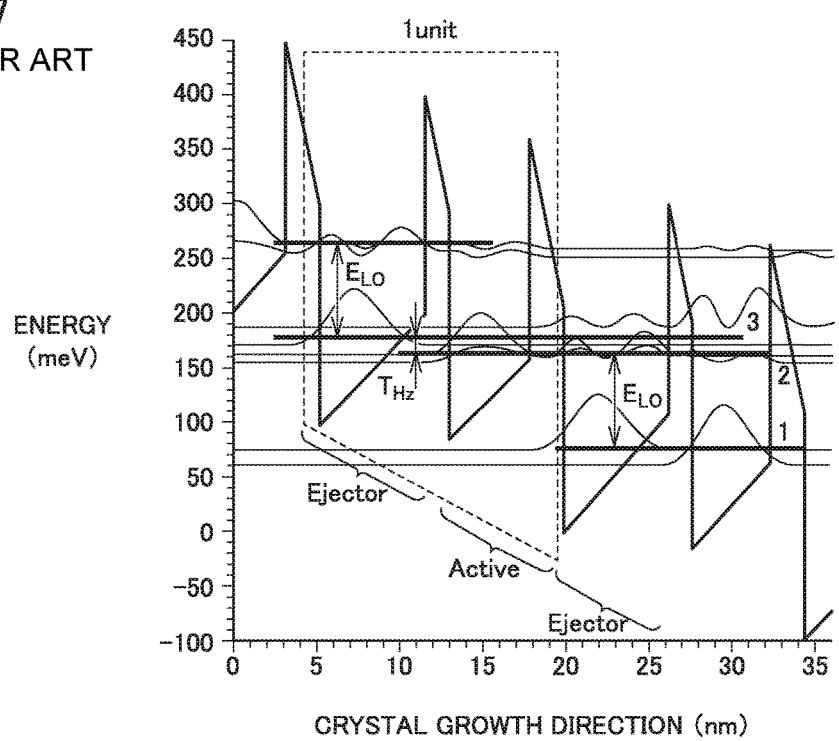

QUANTUM CASCADE LASER

BACKGROUND

1. Field

The present disclosure relates to a quantum cascade laser.

2. Description of the Related Art

Quantum cascade lasers (QCLs) are promising light sources capable of generating electromagnetic waves from the infrared range to the terahertz range (300 GHz to 10 THz) with high power, and the research and development of such quantum cascade lasers has been accelerated in recent years. In particular, there are no promising light sources (small light sources composed of a compound semiconductor) capable of generating electromagnetic waves in the terahertz range, except for QCLs. Therefore, QCLs are the most promising light sources capable of generating electromagnetic waves in the terahertz range. In such QCLs, intersubband population inversion in the conduction band or intersubband population inversion in the valence band in a multi quantum well (MQW) structure composed of a compound semiconductor occurs thereby causing lasing.

QCLs capable of generating electromagnetic waves in the terahertz range have often been produced by using a GaAs-based material, an InP-based material, or a GaSb-based material. However, lasing at a temperature of 200 K or higher has not been reported with any of the materials.

The factor inhibiting lasing at a temperature of 200 K or higher is thermally excited phonon scattering. Thermally excited phonon scattering refers to a phenomenon in which, when electrons or holes (carriers) at the upper lasing level obtain in-plane kinetic energy by heat and thus the difference in energy between the carriers and the lower lasing level is higher than or equal to the vibrational energy of longitudinal optical (LO) phonons, the carriers are scattered by the LO phonons thereby causing nonradiative relaxation to the lower lasing level.

For example, in a QCL (including a GaAs layer as a quantum well layer) that generates electromagnetic waves of about 3 THz (about 13 meV), the energy difference between the upper lasing level and the lower lasing level is about 13 meV (energy corresponding to lasing wavelength). At low temperatures, carriers are often present at the bottom of the energy band of the upper lasing level. Therefore, at temperatures lower than 200 K, the proportion of carriers that are present at the upper lasing level and that make a transition to the lower lasing level due to LO phonon scattering is sufficiently smaller than the proportion of carriers that make a transition due to stimulated emission.

However, when the temperature increases, carriers are thermally excited and the distribution becomes similar to, for example, a quasi-Fermi distribution. When the difference in energy between carriers thermally excited to a level higher than the bottom of the energy band of the upper lasing level and the lower lasing level is concordant with the vibrational energy of LO phonons of a compound semiconductor constituting the quantum well layer of the QCL, the thermally excited carriers make a transition to the lower lasing level due to LO phonon scattering. This transition occurs with a probability higher than that of the stimulated emission from the upper lasing level to the lower lasing level. That is, the thermally excited carriers lose energy due to LO phonon scattering rather than generation of electromagnetic waves. In addition, if the thermally excited carriers make a transition to the lower lasing level due to LO phonon scattering, the carriers that have lost energy occupy the lower lasing level so as to suppress the occurrence of population inversion. As a result, lasing is suppressed.

For example, in the above-described QCL, when carriers present at the upper lasing level obtain an energy of about 23 meV by heat, LO phonon scattering (nonradiative transition) becomes dominant so as to suppress lasing. The vibrational energy of LO phonons is a physical property intrinsic to a material. Therefore, if a GaAs layer, in which the vibrational energy of LO phonons is about 36 meV, is used as a quantum well layer in a QCL capable of generating electromagnetic waves in the terahertz range, it is difficult to operate the QCL at room temperature (300 K (about 26° C.)).

Japanese Unexamined Patent Application Publication No. 2013-171842 proposes that a layer composed of a compound semiconductor different from GaAs is used as a quantum well layer in a QCL capable of generating electromagnetic waves in the terahertz range. Japanese Unexamined Patent Application Publication No. 2013-171842 discloses that a GaN layer is used as a quantum well layer. The vibrational energy of LO phonons of GaN is about 92 meV. Therefore, the likelihood of the above-described thermally excited phonon scattering is believed to be suppressed.

SUMMARY

FIG. 7 illustrates a subband structure of a GaN-based THz-QCL disclosed in Japanese Unexamined Patent Application Publication No. 2013-171842 (corresponding to FIG. 13 in Japanese Unexamined Patent Application Publication No. 2013-171842). In this GaN-based THz-QCL, an AlGaN/GaN-based MQW structure is disposed on an upper surface of a c-plane GaN layer. FIG. 7 illustrates the subband structure in the state in which a bias voltage is applied to a degree that lasing can be caused. The "1 unit" illustrated in FIG. 7 is one period of the QCL. Two quantum well layers are included in one period of the QCL. In the state in which a bias voltage is applied to a degree that lasing can be caused, electrons make a radiative transition from the energy level (3) of the quantum well layer on the left side to the energy level (2) of the quantum well layer on the right side, and electrons at the energy level (2) are relaxed to the energy level (1) at high speed due to LO phonon scattering. In order to utilize this mechanism, the difference between the energy level (2) and the energy level (1) is set to be about 92 meV corresponding to the longitudinal optical phonon (LO phonon) energy of GaN. The light emission energy in the THz range is within the range of about 4 to 45 meV. Therefore, the LO phonon energy of GaN is larger than the light emission energy in the THz range, and if the light emission energy is assumed to be 3 THz (about 13 meV), energy as much as about 7 times the light emission energy is lost due to LO phonon scattering. That is, there is a problem in that most of the electric power input to drive the QCL is consumed as heat due to phonon scattering and the device power efficiency of the structure described in Japanese Unexamined Patent Application Publication No. 2013-171842, in general, a resonant phonon depopulation structure, is reduced.

It is desirable to provide a THz-QCL capable of lasing stably even at room temperature.

According to an aspect of the disclosure, there is provided a quantum cascade laser including a semiconductor substrate and an active layer that is disposed on the semiconductor substrate and has a cascade structure, in which a plurality of unit layered bodies, each composed of a quantum well light emitting layer and an injection layer, are stacked such that the quantum well light emitting layers and the injection layers are alternately stacked, wherein each of the plurality of unit layered bodies has a subband level structure having an upper laser level, a lower laser level, and a relaxation miniband that functions as a relaxation level and is composed of at least two energy levels with an energy spacing smaller than the energy difference ($E_{UL}$) between the upper laser level and the lower laser level, the energy width ($E_{MB}$) of the relaxation miniband is set to be smaller than the energy ($E_{LO}-E_{UL}$) obtained by subtracting the energy difference ($E_{UL}$) between the upper laser level and the lower laser level from the energy ($E_{LO}$) of longitudinal optical phonons ($E_{MB}<E_{LO}-En$), light is generated due to intersubband transition of electrons from the upper laser level to the lower laser level in the quantum well light emitting layer, and the electrons subjected to the intersubband transition are relaxed in the relaxation miniband included in the injection layer and are injected from the injection layer into a quantum well light emitting layer in the unit layered body at a subsequent stage.

BRIEF DESCRIPTION OF THE DRAWINGS

FIGS. 4A and 4B are diagrams illustrating guidelines for design of the miniband width according to an embodiment of the present disclosure;

FIG. 7 is a graph illustrating the energy state of a QCL disclosed in Japanese Unexamined Patent Application Publication No. 2013-171842.

DESCRIPTION OF THE EMBODIMENTS

Figure 1:
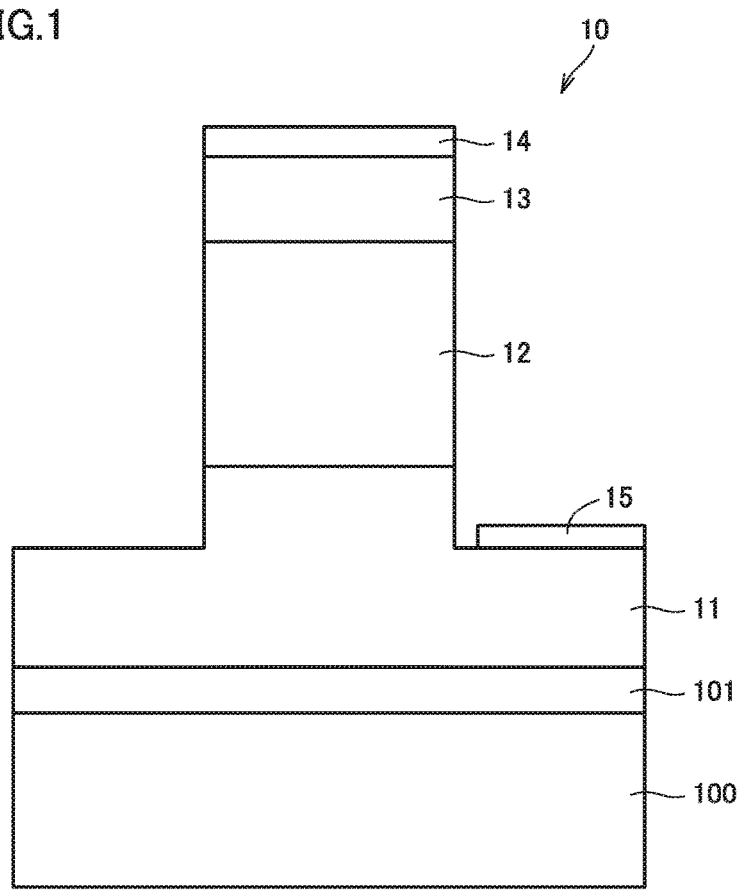
FIG. 1 is a sectional view of a QCL according to an embodiment of the present disclosure.

The present disclosure will be described below with reference to the drawings. A QCL that generates electromagnetic waves in the terahertz range will be described below, but the QCL according to the present disclosure is not limited to the QCL that generates electromagnetic waves in the terahertz range. In the drawings of the present disclosure, the same reference numerals denote the same parts or the corresponding parts. Dimensions such as length, width, thickness, and depth are appropriately changed to clarify and simplify the drawings, and do not correspond to the actual dimensions.

First Embodiment

Structure of QCL

FIG. 1 is a sectional view of a QCL 10 according to a first embodiment of the present disclosure. The QCL 10 in the example illustrated in FIG. 1 includes a semiconductor substrate 100, a strain relaxation layer 101 disposed on an upper surface of the semiconductor substrate 100, a first contact layer 11, an active layer 12 disposed on an upper surface of the first contact layer 11, a second contact layer 13 disposed on an upper surface of the active layer 12, an upper electrode (second electrode) 14 in contact with an upper surface of the second contact layer 13, and a lower electrode (first electrode) 15 in contact with the first contact layer 11 so as to be arranged next to the active layer 12. The active layer 12 includes at least two active layer units stacked on top of each other. Each of the active layer units includes at least one quantum well layer and at least one barrier layer, and the quantum well layers and the barrier layers are alternately stacked.

In the QCL 10, part of the first contact layer 11 on the upper surface side, the active layer 12, and the second contact layer 13 are etched so as to have a mesa shape with a width of, for example, 100 µm. Consequently, a waveguide is formed. The width of the waveguide may be changed in accordance with the use of the QCL 10. The width of "100 µm" is merely an example of the width of a waveguide that allows single-mode oscillation of electromagnetic waves in the terahertz range.

Semiconductor Substrate

The semiconductor substrate 100 is composed of a compound semiconductor (first compound semiconductor). The first compound semiconductor is preferably denoted by general formula $Al_{x1}In_{y1}Ga_{(1-x1-y1)}N$ ($0 \le x1 \le 1$ and $0 \le y1 \le 1$). More preferably, the first compound semiconductor is a material having a lattice constant close to that of a material used for quantum well light emitting layers described later. That is, the first compound semiconductor is GaN, InN, a fourth compound semiconductor described later, or a material having a lattice constant that is between the lattice constant of GaN or InN and the lattice constant of the fourth compound semiconductor.

The semiconductor substrate 100 is, for example, preferably an m-plane ({1-100} plane) free-standing GaN substrate. More preferably, the semiconductor substrate 100 is an m-plane free-standing GaN substrate polished after being cut such that the upper surface of the semiconductor substrate 100 has a (1-100) plane orientation. Consequently, an AlGaN/GaN-based MQW structure having good crystal quality can be grown. The semiconductor substrate 100 may be composed of GaN and the angle formed by the upper surface of the substrate and the m-plane ({1-100} plane) of GaN is preferably −5 degrees or more and +5 degrees or less (further preferably −1 degree or more and +1 degree or less). Also in this case, the present inventors have ascertained that an AlGaN/GaN-based MQW structure having good crystal quality could be grown.

Strain Relaxation Layer

The strain relaxation layer 101 is composed of a single-layer compound semiconductor or a plurality of layers of compound semiconductors having different compositions (collectively referred to as compound semiconductor group). The strain relaxation layer 101 is disposed so as to relax the lattice constant of the semiconductor substrate 100 for the purpose of reducing tensile strain generated in an AlGaN layer included in the active layer described later. The strain relaxation layer 101 is preferably composed of a combination of a plurality of compound semiconductors denoted by general formula $Al_{x2}In_{y2}Ga_{(1-x2-y2)}N$ ($0 \le x2 \le 1$ and $0 \le y2 \le 1$). More preferably, the strain relaxation layer 101 has a two-layer structure composed of an AlN layer of about 25 nm and an AlGaN layer of about 1 µm. The configuration of the AlGaN layer serving as the second layer is preferably substantially the same as the composition of the fourth compound semiconductor described later and is most preferably, for example, $Al_{0.145}Ga_{0.855}N$.

Contact Layer

The first contact layer 11 has to come into good ohmic contact with the lower electrode 15 and, in addition, has to strongly absorb light with an emission wavelength such that the light can be confined in the active layer 12. An n-type dopant (for example, Si) may be added so as to accomplish such a purpose. Consequently, the resistance of the first contact layer 11 itself can be reduced, and the contact resistance between the first contact layer 11 and the lower electrode 15 can also be reduced. Further, electromagnetic waves in the terahertz range are absorbed by free-carrier absorption. The n-type dopant concentration in the first contact layer 11 is preferably about $1\times10^{17}/cm^3$ or more and about $5\times10^{19}/cm^3$ or less, and more preferably about $1\times10^{17}/cm^3$ or more and about $3\times10^{18}/cm^3$ or less.

The thickness of the first contact layer 11 is preferably about 10 nm or more and about 1 μm or less, and more preferably about 100 nm or more and about 500 nm or less.

Active Layer
Well Layer

The active layer 12 is formed by repeatedly stacking a plurality of active layer units, each composed of at least two quantum wells. The quantum well is formed by alternately stacking well layers and barrier layers. The well layer is composed of a compound semiconductor (third compound semiconductor). The third compound semiconductor is a material having a band gap smaller than the band gap of the fourth compound semiconductor used for the barrier layer described later. The third compound semiconductor is preferably denoted by general formula $Al_{x3}In_{y3}Ga_{(1-x3-y3)}N$ ($0 \leq x3 \leq 1$ and $0 \leq y3 \leq 1$) and is more preferably GaN or $Al_{x3}In_{y3}Ga_{(1-x3-y3)}N$ with at least one of x3 and y3 being adjusted so as to have a lattice constant close to the lattice constant of the first compound semiconductor that is a material for forming the semiconductor substrate 100. In the case where the semiconductor substrate 100 is a GaN substrate such as an m-plane free-standing GaN substrate, the third compound semiconductor may be GaN. This improves the crystal quality of the quantum well layer composed of GaN.

Barrier Layer

The barrier layer is composed of a compound semiconductor (fourth compound semiconductor). The fourth compound semiconductor may be a material having a band gap larger than the band gap of the third compound semiconductor. The fourth compound semiconductor is preferably denoted by general formula $Al_{x4}In_{y4}Ga_{(1-x4-y4)}N$ ($0 \leq x4 \leq 1$ and $0 \leq y4 \leq 1$) and is more preferably $Al_{0.145}Ga_{0.855}N$.

Entire Active Layer

In the active layer unit, a state called a miniband is formed by arranging a plurality of quantum wells (structure in which barrier layers and well layers are alternately stacked) and combining a plurality of quantum levels (levels that appear as a result of quantization of electrons by being confined in well layers). An example of a suitable active layer unit will be described. The active layer unit is composed of 18 layers (9 well layers and 9 barrier layers) in total and is constructed as described below. In this regard, (a) to (i) are provided for the sake of explanations below.

First layer (a): GaN 9.2 nm
Second layer: $Al_{0.145}Ga_{0.855}N$ 2.4 nm
Third layer (b): GaN 16.5 nm
Fourth layer: $Al_{0.145}Ga_{0.855}N$ 1.5 nm
Fifth layer (c): GaN 10.8 nm
Sixth layer: $Al_{0.145}Ga_{0.855}N$ 1.0 nm
Seventh layer(d): GaN 9.5 nm
Eighth layer: $Al_{0.145}Ga_{0.855}N$ 0.6 nm
Ninth layer (e): GaN 9.5 nm
Tenth layer: $Al_{0.145}Ga_{0.855}N$ 0.6 nm
Eleventh layer (f): GaN 9.5 nm
Twelfth layer: $Al_{0.145}Ga_{0.855}N$ 0.6 nm
Thirteenth layer (g): GaN 9.5 nm
Fourteenth layer: $Al_{0.145}Ga_{0.855}N$ 0.6 nm
Fifteenth layer (h): GaN 9.5 nm
Sixteenth layer: $Al_{0.145}Ga_{0.855}N$ 0.6 nm
Seventeenth layer (i): GaN 9.5 nm
Eighteenth layer: $Al_{0.145}Ga_{0.855}N$ 3.2 nm The above-described configuration of the active layer unit is an example and there is no particular limitation regarding the number of well layers and the number and the thickness of the barrier layers in each of the active layer units. The eleventh layer is doped with silicon (Si) serving as a dopant at a concentration of $5\times10^{17}$ cm$^{-3}$.

The active layer 12 is produced by repeatedly forming the active layer unit and the thickness of the active layer 12 is preferably 0.5 μm or more and 100 μm or less, and more preferably 1 μm or more and 20 μm or less.

Second Contact Layer

The second contact layer 13 is composed of a compound semiconductor (fifth compound semiconductor). The fifth compound semiconductor is preferably denoted by general formula $Al_{x5}In_{y5}Ga_{(1-x5-y5)}N$ ($0 \leq x5 \leq 1$ and $0 \leq y5 \leq 1$). More preferably, the fifth compound semiconductor is GaN.

The second contact layer 13 may contain an n-type dopant (for example, Si). Consequently, the resistance of the second contact layer 13 itself can be reduced, and the contact resistance between the second contact layer 13 and the upper electrode 14 can also be reduced. The n-type dopant concentration in the second contact layer 13 is preferably $1\times10^{17}/cm^3$ or more and $1\times10^{20}/cm^3$ or less, and more preferably $1\times10^{18}/cm^3$ or more and $5\times10^{19}/cm^3$ or less.

The thickness of the second contact layer 13 is preferably 10 nm or more and 1 μm or less, and more preferably 100 nm or more and 500 nm or less.

Upper Electrode and Lower Electrode

The upper electrode 14 may be composed of a metal material having good ohmic characteristics with the second contact layer 13. The upper electrode 14 is, for example, an ohmic electrode formed by stacking a Ti layer and an Al layer. The upper electrode 14 may be composed of a metal different from Ti and Al or may be a transparent oxide electrode.

The lower electrode 15 may be composed of a metal material having good ohmic characteristics with the first contact layer 11 and may be, for example, an ohmic electrode formed by stacking a Ti layer and an Al layer. The lower electrode 15 may be composed of a metal different from Ti and Al or may be a transparent oxide electrode.

Verification of Effects

Figure 2:
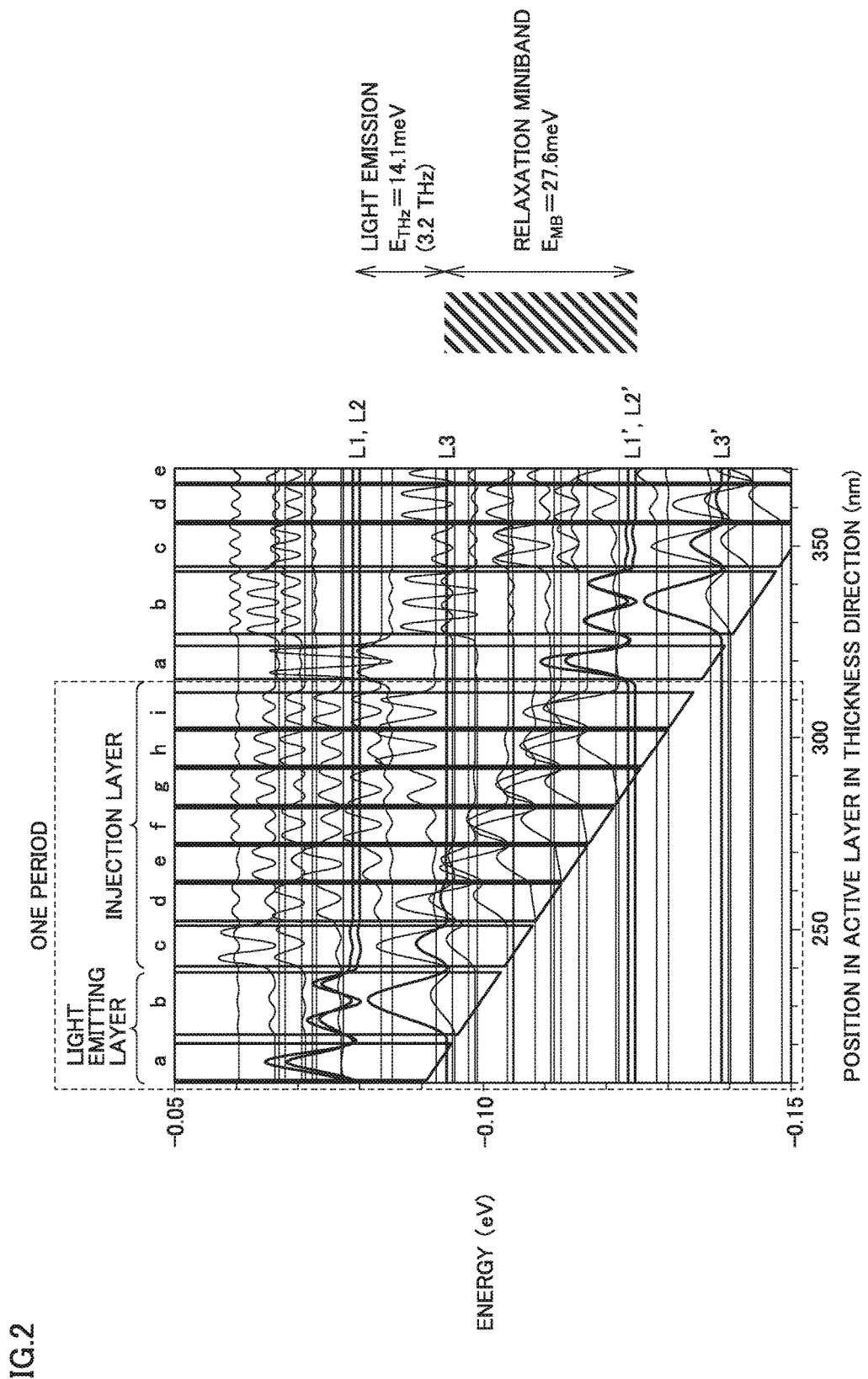
FIG. 2 is a diagram illustrating the energy band structure and the shape of a wave function of an active layer according to an embodiment of the present disclosure.

The effects of the present embodiment were verified by simulation. In the simulation, a single-band Hamiltonian was assumed to be an electron Hamiltonian, and the potential energy and the wave function of electrons in the case where a bias voltage of about 45 meV per active layer unit was applied were calculated. FIG. 2 illustrates the calculation results.

In FIG. 2, the horizontal axis shows a position in the active layer in the thickness direction and the vertical axis shows the potential energy of electrons. As illustrated in FIG. 2, the active layer 12 according to the present disclosure has a cascade structure, in which a plurality of unit layered bodies (active layer units), each composed of a quantum well light emitting layer (light emitting layer) and an injection layer, are stacked and the light emitting layers and the injection layers are alternately stacked. In FIG. 2, "one period" enclosed in a dotted line corresponds to one active layer unit. Energy levels L1, L2, L3, L1', L2', and L3' indicated by thick lines are energy levels related to optical transition, that is, light emission. The value on the vertical axis indicates the potential energy of electrons and the shape corresponds to the shape of the wave function. The energy levels, other than L1 to L3 and L1' to L3', not related to the optical transition are indicated by thin lines in the drawing (reference numerals are not provided).

As illustrated in FIG. 2, the active layer unit including 18 layers in total has many energy levels. The energy levels L1 to L3 at which many electrons are present in the well layers (a) and (b) in FIG. 2 are energy levels related to optical transition. The energy levels L1 and L2 are upper lasing levels (upper laser levels), and electrons injected into the energy levels L1 and L2 are relaxed to the energy level L3 that is a lower lasing level (lower laser level). At this time, the difference between the energy level L1 and the energy level L3 or the difference between the energy level L2 and the energy level L3 serves as the light emission energy. In the case of the structure illustrated in FIG. 2, the energy difference between the energy level L2 and the energy level L3 is about 14.1 meV. This is about 3.2 THz in terms of frequency. The energy level L1 is not considerably apart from the energy level L2 and, therefore, is involved in the optical transition as with the energy level L2.

There are many energy levels at which electrons can be present (wave functions have values) in the well layers (b) to (i) between the energy level L3 and the energy level L1' (or the energy level L2'). Many wave functions have values over different wells, and each of spacings between energy levels are several milli-electron volts and are smaller than the energy difference of optical transition. Therefore, electrons relaxed to the energy level L3 (well layer (b)) due to optical transition can continuously make transitions to well layers (c) to (i) while the energy is lost. In general, an aggregate of energy levels, in which a plurality of well layers are combined and electrons can continuously make transitions between wells, as described above, is called a miniband. In the present disclosure, each of the plurality of unit layered bodies (active layer units) included in the active layer has a subband level structure having an upper laser level, a lower laser level, and a relaxation miniband that functions as a relaxation level and is composed of at least two energy levels with an energy spacing smaller than the energy difference (En) between the upper laser level and the lower laser level.

In the case of the structure illustrated in FIG. 2, the relaxation miniband spatially extends over the well layers (c) to (i) and extends over the energy level L3 to energy level L1' with respect to the energy. When the energy difference between the upper end and the lower end of the relaxation miniband is assumed to be the energy width ($E_{MB}$) of the relaxation miniband, in the structure illustrated in FIG. 2, the energy width ($E_{MB}$) of the relaxation miniband is about 27.6 meV. The energy width ($E_{MB}$) of the relaxation miniband in the present disclosure is set to be smaller than the energy ($E_{LO}-E_{UL}$) obtained by subtracting the energy difference ($E_{UL}$) between the upper laser level and the lower laser level from the energy ($E_{LO}$) of longitudinal optical phonons ($E_{MB}<E_{LO}-E_{UL}$).

Figure 3:
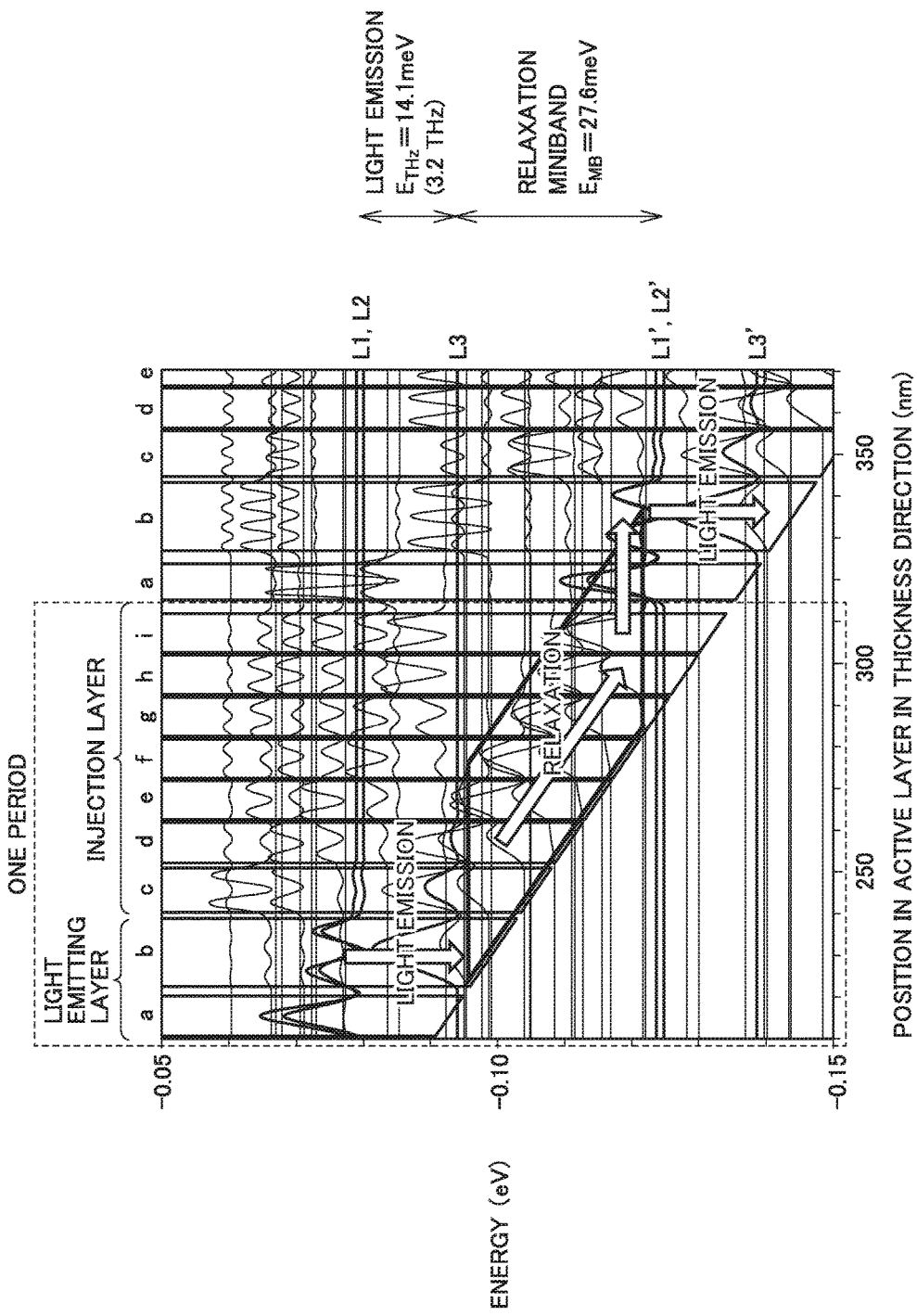
FIG. 3 is a diagram illustrating the flow of electrons according to an embodiment of the present disclosure.

The flow of electrons and the process of light emission will be described with reference to FIG. 3. Electrons injected into the energy level L1 and the energy level L2 of the well layer (b) through the well layer (a) make a transition, with light emission, to the energy level L3 of the well layer (b). The electrons that have made a transition to the energy level L3 of the well layer (b) are injected into the well layer (c) due to a tunnel effect. The electrons injected into the well layer (c) continuously move, well layer (c)→well layer (d)→well layer (e)→well layer (f)→well layer (g)→well layer (h)→well layer (i), in the relaxation miniband while being relaxed and are injected from the well layer (i) into an active layer unit (a) (energy levels L1' and L2') at a subsequent stage. In this manner, in the configuration of the present disclosure, light is generated due to intersubband transition of electrons from the upper laser level to the lower laser level in the quantum well light emitting layer and, in addition, the electrons subjected to the intersubband transition are relaxed in the relaxation miniband included in the injection layer and are injected from the above-described injection layer to a quantum well light emitting layer in a unit layered body at a subsequent stage.

The relaxation from the energy level L3 to the energy level L1' through the relaxation miniband occurs at a very high speed due to electron-electron scattering, interface roughness scattering, impurity scattering, acoustic phonon scattering, and the like. The speed of electron extraction from the energy level L3 is larger than the optical transition (stimulated emission transition) from the energy levels L1 and L2 to the energy level L3 and, therefore, the energy levels L1 and L2 and the energy level L3 are brought into a population inversion state so as to generate a gain. In the case where an external resonator is disposed in this state and the gain becomes larger than a loss in the resonator, a QCL 100 comes into a lasing state.

In the present disclosure, the energy width ($E_{MB}$) of the relaxation miniband may be smaller than the energy obtained by subtracting the energy difference ($E_{UL}$) between the upper laser level and the lower laser level and the temperature energy ($E_{kT}$) determined as the product of the Boltzmann constant (k) and the temperature (T) from the energy ($E_{LO}$) of longitudinal optical phonons ($E_{MB}<E_{LO}-E_{UL}-E_{kT}$). The energy ($E_{LO}$) of longitudinal optical phonons, the emission wavelength (emission energy ($E_{THz}$) or a difference ($E_{UL}$) between the energy level L1 or energy level L2 that is an upper lasing level (upper laser level) and the energy level L3 that is a lower lasing level (lower laser level)), and the most suitable relationship between the energy width ($E_{MB}$) of the relaxation miniband and the temperature energy ($E_{kT}$), that is, the suitable guidelines for design of the QCL, will be described below.

In general, the relaxation of electrons due to LO phonon scattering is a very high-speed process compared with the above-described relaxation due to stimulated emission and, therefore, relaxation of electrons present at the energy levels L1 and L2 due to the LO phonon scattering has to be suppressed. Meanwhile, in the case where the temperature increases, electrons can have high energy due to heat. An average thermal energy is defined as the temperature energy ($E_{kT}$) determined as the product of the Boltzmann constant (k) and the temperature (T). The temperature energy ($E_{kT}$) is, for example, about 26 meV at a room temperature of 300 K.

In the case where there is a state (relaxation miniband) that is allowed to exist at a level lower, by LO phonon energy ($E_{LO}$), than the energy level L1 or the energy level L2 exists, electrons at the energy level L1 or the energy level L2 do not emit light and make a nonradiative transition due to the LO phonon scattering because of the above-described high speed of the LO phonon scattering. Therefore, it is desirable that no energy level exist at an energy lower, by LO phonon energy ($E_{LO}$), than the energy level L1 or the energy level L2. FIGS. 4A and 4B are diagrams illustrating guidelines for the design of the miniband width according to an embodiment of the present disclosure. As illustrated in FIG. 4A, in the case where no energy level exists in the state, at which the energy is lower, by LO phonon energy ($E_{LO}$), than the energy of the state, at which the energy is higher, by the temperature energy ($E_{kT}$), than the energy level L1 or the energy level L2, the relaxation mechanism of thermally excited electrons due to LO phonon scattering can be suppressed and, thereby, the population inversion of the QCL is maintained even when the temperature increases.

As illustrated in FIG. 4B, even in the case where no energy level exists at the energy lower, by LO phonon energy ($E_{LO}$), than the energy level L1 or the energy level L2, if an energy level (relaxation miniband) exists at an energy lower, by LO phonon energy ($E_{LO}$), than the energy higher, by the temperature energy ($E_{kT}$), than the energy level L1 or the energy level L2, the temperature increases, thermally excited electrons are relaxed due to LO phonon scattering, and a problem occurs in that the population inversion is reduced as the temperature increases.

From the above-described conditions, $$E_{kT}+E_{MB}+E_{THz}-E_{LO}<0 \quad \text{formula (1)}$$

is derived as a suitable condition. When the operation temperature and the emission wavelength are determined, desirable $E_{MB}$ can be designed by using $$E_{MB}<E_{LO}-E_{kT}-E_{THz} \quad \text{formula (2)}$$

because $E_{LO}$ is a physical property value intrinsic to a material and $E_{kT}$ is determined by a predetermined temperature at which the device is operated.

Figure 5A:
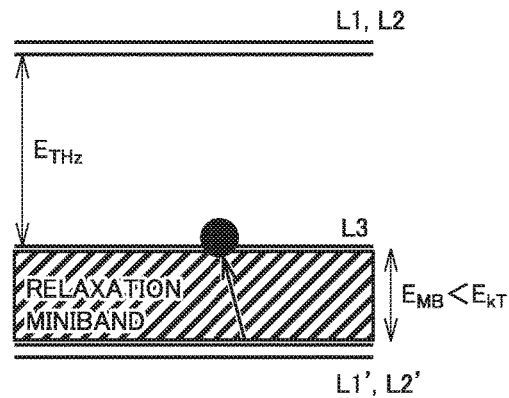
FIGS. 5A and 5B are diagrams illustrating guidelines for design of the miniband width according to an embodiment of the present disclosure.
Figure 5B:
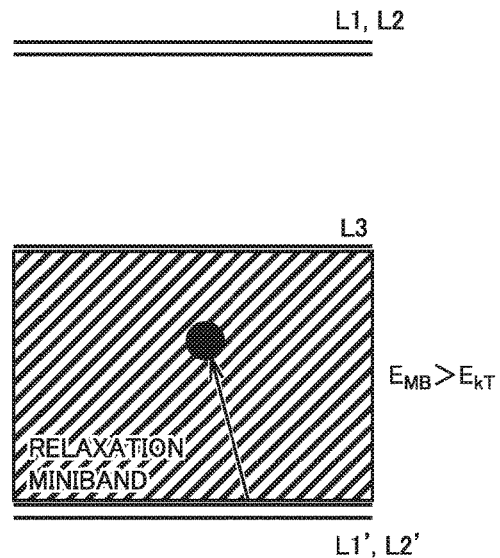

In addition to the condition of formula (2) above, a further suitable guideline will be described with reference to FIGS. 5A and 5B. As illustrated in FIG. 5A, in the case of $E_{MB}<E_{kT}$, some of electrons at the energy levels L1' and L2' in the vicinity of the bottom of the relaxation miniband can make a transition to the vicinity of the upper end of the relaxation miniband, that is, an energy level L3, due to thermal excitation. The transition to the energy level L3 due to the thermal excitation suppresses population inversion between the energy levels L1 and L2 and the energy level L3. Consequently, as illustrated in FIG. 5B, it is desirable to design the energy width ($E_{MB}$) of the relaxation miniband such that $$E_{MB}>E_{kT} \quad \text{formula (3)}$$

is satisfied.

From formula (2) and formula (3) above, formula (4) below is derived as the guideline for the design of the energy width of the relaxation miniband.

$$E_{kT}<E_{MB}<E_{LO}-E_{kT}-E_{THz} \quad \text{formula (4)}$$

The well layer of the QCL 10 is GaN, and the LO phonon energy ($E_{LO}$) is 92 meV. The emission energy ($E_{THz}$) is 14.1 meV. Under the assumption that the operation is performed at room temperature of 300 K, $E_{kT}$ is 26 meV and, therefore, the condition of a suitable energy width $E_{MB}$ of the miniband is 26 meV or more and 51.9 meV or less on the basis of formula (4) above. As is clear from FIG. 2, the energy width of the miniband of the QCL 10 is 27.6 meV. Therefore, formula (4) above is satisfied and the operation can be performed at room temperature of 300 K.

Production of QCL

A strain relaxation layer 101, a first contact layer 11, an active layer 12, and a second contact layer 13 are formed on an upper surface of a semiconductor substrate 100 by, for example, a molecular beam epitaxy method (MBE) or a metal organic vapor phase epitaxy method (MOVPE). An upper electrode 14 is formed on an upper surface of the second contact layer 13 and a lower electrode 15 is formed on a lower surface of the semiconductor substrate 100 by, for example, an electron beam deposition method. Part of each of the upper electrode 14, the second contact layer 13, the active layer 12, and the first contact layer 11 is etched by, for example, a reactive ion etching (RIE) method so as to form the mesa shape illustrated in FIG. 1. Further, optical mirror structures are formed at both ends in the direction perpendicular to the mesa (plane parallel to the drawing) by cleavage. In this manner, the QCL illustrated in FIG. 1 is produced.

Some features of the QCL 10 according to the first embodiment of the present disclosure compared with the QCL, as illustrated in FIG. 7, in the relate art (QCL disclosed in Japanese Unexamined Patent Application Publication No. 2013-171842) will be described. Regarding the QCL in the related art, the LO phonon scattering is utilized for the mechanism to extract electrons at high speed from the energy level (2) in FIG. 7 (corresponding to the energy level L3 of the QCL 10 according to the first embodiment of the present disclosure) to the energy level (1). Therefore, a loss, which corresponds to the energy ($E_{LO}$) of longitudinal optical phonons, of the input power occurs. On the other hand, in the case of the QCL 10 according to the first embodiment of the present disclosure, the energy loss corresponds to the energy width ($E_{MB}$) of the relaxation miniband. For example, in the cases of the QCL in the related art and the QCL 10 according to the first embodiment of the present disclosure, where GaN is used as the material, the energy loss of the QCL 10 according to the first embodiment of the present disclosure is about 27.6 meV and, therefore, is about one third the energy loss of the QCL in the related art of about 92 meV. Consequently, the QCL 10 according to the first embodiment of the present disclosure can generate terahertz light that exhibits a higher efficiency.

Second Embodiment

Figure 6:
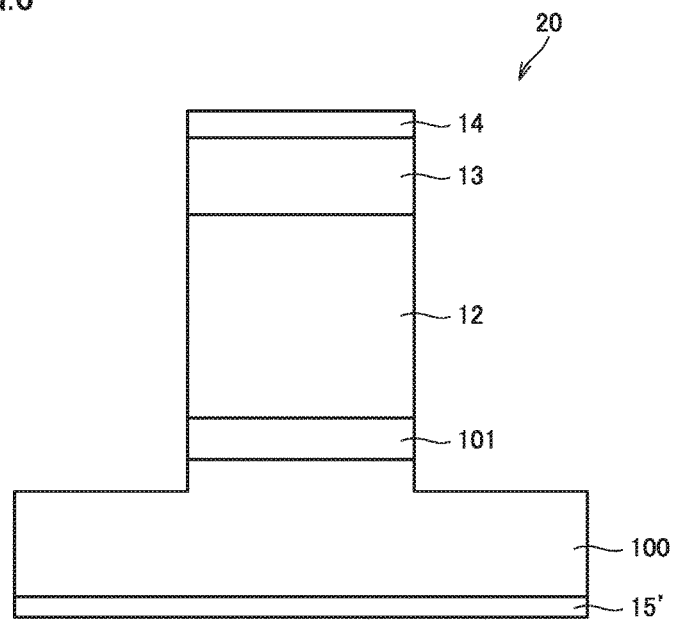
FIG. 6 is a sectional view of a QCL according to an embodiment of the present disclosure.

FIG. 6 is a sectional view of a QCL 20 according to a second embodiment of the present disclosure. In the QCL 20 illustrated in FIG. 6, according to the second embodiment of the present disclosure, an active layer 12 is stacked on a strain relaxation layer 101 without interposing a first contact layer, and a lower electrode 15' is disposed on a lower surface of a substrate 100. The above-described QCL 20 according to the second embodiment has a feature that a lower electrode can be disposed on the opposite side of the upper electrode and, thereby, junction down configuration (configuration in which an active layer is attached to a heat sink) having good heat dissipation effect compared with the QCL 10 according to the above-described first embodiment can be employed.

It should be understood that all the embodiments in the present disclosure are examples and are not limitative. The scope of the the present disclosure is not defined by the above-described description but is defined in the appended claims. The present disclosure is intended to cover various changes within the spirit and scope of the claims and the equivalents thereof.

The present disclosure contains subject matter related to that disclosed in Japanese Priority Patent Application JP 2016-101182 filed in the Japan Patent Office on May 20, 2016, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A quantum cascade laser comprising:
   a semiconductor substrate; and
   an active layer that is disposed on the semiconductor substrate and has a cascade structure, in which a plurality of unit layered bodies, each composed of a quantum well light emitting layer and an injection layer, are stacked such that the quantum well light emitting layers and the injection layers are alternately stacked,
   wherein each of the plurality of unit layered bodies has a subband level structure having an upper laser emission level, a lower laser emission level, and a relaxation miniband that is composed of at least two energy levels which function as relaxation levels with an energy spacing smaller than the energy difference ($E_{UL}$) between the upper laser emission level and the lower laser emission level,
   the energy width ($E_{MB}$) of the relaxation miniband is set to be smaller than the energy ($E_{LO}-E_{UL}$) obtained by subtracting the energy difference ($E_{UL}$) between the upper laser emission level and the lower laser emission level from the energy ($E_{LO}$) of longitudinal optical phonons ($E_{MB}<E_{LO}-E_{UL}$),
   light is generated due to intersubband transition of electrons from the upper laser emission level to the lower laser emission level in the quantum well light emitting layer, and
   the electrons subjected to the intersubband transition are relaxed in the relaxation miniband included in the injection layer and are injected from the injection layer into a quantum well light emitting layer in the unit layered body at a subsequent stage.

2. The quantum cascade laser according to claim 1, wherein the energy width ($E_{MB}$) of the relaxation miniband is smaller than the energy obtained by subtracting the energy difference ($E_{UL}$) between the upper laser emission level and the lower laser emission level and the temperature energy ($E_{kT}$) of the quantum cascade laser determined as the product of the Boltzmann constant (k) and the temperature (T) of the quantum cascade laser from the energy ($E_{LO}$) of longitudinal optical phonons ($E_{MB}<E_{LO}-E_{UL}-E_{kT}$).

3. The quantum cascade laser according to claim 1, wherein the energy width ($E_{MB}$) of the relaxation miniband is larger than the temperature energy ($E_{kT}$) of the quantum cascade laser determined as the product of the Boltzmann constant (k) and the temperature (T) of the quantum cascade laser ($E_{MB}>E_{kT}$).

4. The quantum cascade laser according to claim 3, wherein the energy width ($E_{MB}$) of the relaxation miniband is larger than 26 meV ($E_{MB}>26$ meV).

5. The quantum cascade laser according to claim 1, wherein the unit layered body is composed of a material denoted by $Al_xIn_yGa_{(1-x-y)}N$ ($0 \leq x \leq 1$ and $0 \leq y \leq 1$).

6. The quantum cascade laser according to claim 5, wherein the semiconductor substrate is composed of GaN, the angle formed by an upper surface of the semiconductor substrate and an m-plane ({1-100} plane) of GaN is −5 degrees or more and +5 degrees or less.

* * * * *